United States Patent
Notenboom

(10) Patent No.: US 6,531,191 B1
(45) Date of Patent: Mar. 11, 2003

(54) METHOD OF MANUFACTURING A SINTERED STRUCTURE ON A SUBSTRATE

(75) Inventor: Gerardus J. A. M. Notenboom, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 867 days.

(21) Appl. No.: 08/834,410

(22) Filed: Apr. 16, 1997

(30) Foreign Application Priority Data

Apr. 17, 1996 (EP) ............................................. 96201003

(51) Int. Cl.⁷ ............................ B29C 35/08; B05D 3/06
(52) U.S. Cl. ...................... 427/554; 427/559; 427/542; 156/62.2; 264/409; 264/497
(58) Field of Search ................................. 427/555, 554, 427/556, 559, 596, 597, 542; 156/62.2; 264/409, 497; 219/121.73, 121.78, 121.85

(56) References Cited

U.S. PATENT DOCUMENTS

| | | | |
|---|---|---|---|
| 4,665,492 A | * 5/1987 | Masters | 364/468 |
| 4,810,525 A | * 3/1989 | Morita et al. | 427/597 |
| 4,997,809 A | * 3/1991 | Gupta | |
| 5,076,869 A | * 12/1991 | Bourell et al. | 156/62.2 |
| 5,132,248 A | * 7/1992 | Drummond et al. | 427/556 |
| 5,284,695 A | * 2/1994 | Barlow et al. | 156/62.2 |
| 5,314,003 A | * 5/1994 | Mackay | |
| 5,348,775 A | * 9/1994 | Lin | |
| 5,372,861 A | * 12/1994 | Kerrand et al. | 427/556 |
| 5,409,741 A | * 4/1995 | Laude | |
| 5,688,564 A | * 11/1997 | Coddet et al. | |

FOREIGN PATENT DOCUMENTS

WO   WO 97/38810   * 10/1997

OTHER PUBLICATIONS

*Hackh's Chemical Dictionary*, 3ʳᵈ ed, McGraw–Hill Book Co., Ink. N.Y., excerpts pp. 372, 785 & 787, (no month) 1944.*

Journal of Materials Science Letters 14 (1995) p. 1562–1565 no month.

* cited by examiner

Primary Examiner—Marianne Padgett
(74) Attorney, Agent, or Firm—Ernestine C. Bartlett

(57) ABSTRACT

A Method of manufacturing a sintered structure on a substrate is provided. To this end, a particle-charged liquid is provided on the substrate by means of a (multiple print head) ink jet printer. Subsequently, the liquid is evaporated and the particles contained therein are sintered layer by layer. Said layer-by-layer laser sintering enables 3-dimensional products having a relatively high dimensional accuracy to be manufactured. Preferably, evaporation of the liquid also takes place by means of (the same or) a laser. The liquid preferably comprises particles of glass, ceramics or metal compounds in the form of a sol-gel solution or a colloidal sol.

5 Claims, 1 Drawing Sheet

METHOD OF MANUFACTURING A SINTERED STRUCTURE ON A SUBSTRATE

BACKGROUND OF THE INVENTION

The invention relates to a method of manufacturing a sintered structure on a substrate, in which method a liquid which is charged with particles is provided on said substrate by means of an ink jet printer, whereafter the liquid is evaporated and the particles present in said liquid are sintered. Such a method can very advantageously be used in the manufacture of thin sintered layers or composite structures whose shape and size are well-defined. It is alternatively possible, however, to use such a method in the additive manufacture of 3-dimensional sintered products, such as multilayer structures and ceramic multilayer components.

A method of the type mentioned in the opening paragraph is known per se from J. Mat. Sci. Lett. 14 (22), 1562–1565 (1995). Said document more particularly describes a method of manufacturing a sintered ceramic layer comprising predominantly zirconium oxide by means of ink jet technology. To this end, a ceramic powder comprising yttrium-containing zirconium-oxide particles is mixed with a binder, a dispersing agent and a solvent. Ten thin layers of this liquid are ink jet printed onto a substrate to form a multilayer. After evaporation of the liquid, the resultant layer of powder particles is sintered in a furnace at a temperature ranging from 500 to 1600° C. for one hour.

The known method has an important drawback, namely that the dimensional accuracy of the sintered (multi)layer is relatively small. In practice it has been found that the 3-dimensional sintered products manufactured by means of the known method may be subject to 15% shrinkage or more. As the dimensional accuracy of such sintered products must meet ever higher requirements, which can be partly attributed to the ongoing miniaturization, this shrinkage effect is increasingly being regarded as very disadvantageous.

SUMMARY OF THE INVENTION

It is an object of the invention to provide a method by means of which said disadvantage can be obviated. The invention more particularly aims at a method of manufacturing structured layers in which the problem of shrinkage is substantially reduced and brought under control. The method in accordance with the invention should enable sintered, shaped products, such as multilayer components, to be manufactured with a high degree of dimensional accuracy.

These and other objects of the invention are achieved by a method of the type mentioned in the opening paragraph, which is characterized in that the particles are sintered layer by layer by means of a laser.

The invention is based on the recognition that a sintering process which is carried out layer by layer leads to much less shrinkage in the plane of the layer than a process in which a complete, 3-dimensional product is sintered. This can be attributed to the fact that in the method in accordance with the invention shrinkage takes place predominantly in the direction at right angles to the plane of the substrate on which the layer of charged liquid is provided, whereas shrinkage in the directions parallel to the surface of the substrate is much smaller. By building the 3-dimensional product up as it were of thin, sintered layers, a dimensional accuracy can be attained which is much greater than the dimensional accuracy which can be attained when the complete product is subjected to a single sintering process.

Droplets provided by means of an ink jet printer typically have sectional and height dimensions of, respectively, 50 microns or less and approximately 5 microns. After evaporation and sintering, the sectional dimension of the droplets is substantially unchanged, whereas the height dimension has decreased by 80–95%. By carrying out the inventive method a number of times in a row, a product having a high dimensional accuracy can be formed in a controlled layer-by-layer production process.

Due to the use of a laser, the sinter time of the individual droplets is less than approximately 1 millisecond. By virtue thereof, the method in accordance with the invention enables complete products to be manufactured in an economically acceptable manner. For example, it has been found that arbitrarily shaped ceramic layers can be provided on a substrate at a rate of 5 $cm^2$/s and more by means of the method in accordance with the invention. The line width of the layers is 50 microns and the accuracy with which they are provided is 5 microns.

The method in accordance with the invention can be carried out by means of various types of lasers. A $CO_2$ laser yields good results if ceramic layers are manufactured. If metallic layers are provided, use is preferably made of an Nd:YAG laser to evaporate the liquid and sinter the particles contained therein. The necessary power is at least 1 kW/$cm^2$. To optimize the drying and sintering processes, use is preferably made of specific pulse profiles.

In the method in accordance with the invention, various types of substrates can be used. However, the use of non-adhering substrates is preferred. Said substrates are especially advantageous if the ultimately formed product has to be detached from the substrate. This applies in particular to ceramic multilayer elements, such as CMAs (ceramic multilayer actuators), CMTs (ceramic multilayer transformers) and CMCs (ceramic multilayer capacitors). The use of a soluble substrate, for example in the form of salt, is also interesting.

A preferred embodiment of the method in accordance with the invention is characterized in that for evaporating the liquid use is also made of a laser. It is noted that the liquid can also be evaporated in other ways, for example, by means of IR radiation. It is alternatively possible to employ heated substrates, which cause the liquid to evaporate immediately after it has been provided. However, evaporation of the liquid by means of a laser proves to be more efficient.

A further preferred embodiment of the method in accordance with the invention is characterized in that for evaporating the liquid and sintering the particles use is made of the same laser. In this case, the coupling-optical system of the laser should be such that the laser beam is split into a relatively low-energy beam for the evaporation of the liquid and a relatively high-energy beam for the sintering of the particles.

Yet another preferred embodiment of the method in accordance with the invention is characterized in that the liquid comprises particles of glass, ceramics or metal compounds in the form of a sol-gel solution or a colloidal sol. In principle, use can be made of a suspension of a fine powder of metal compounds, such as metal oxides and/or metal nitrides. However, the use of such a powder has the disadvantage that agglomerations of powder particles can be formed in such suspensions. These agglomerations may obstruct the nozzle.

This problem does not occur if use is made of a sol-gel solution or a colloidal sol of the material to be sintered. Such a solution or sol is characterized in that it comprises particles which are in an aqueous and/or organic matrix. Such a solution or sol is stabilized with respect to precipitation or agglomeration by mutual repulsion of the particles, for example, due to the presence of auxiliary substances in the liquid or charge repulsion. This considerably reduces the risk of obstruction of the nozzle of an ink jet printer. The average particle size should be below 1000 nm. Preferably, use is made of colloidal sols whose average particle size ranges between 10 and 100 nm. Such sols are available, for example, from Merck. The colloidal sols used preferably contain 1–5 vol. % of sinterable material. They also contain salts, stabilizers and fluxes.

A further preferred embodiment of the method in accordance with the invention is characterized in that an ink jet printer having a multiple print head is used. This has the advantage that many products can be manufactured simultaneously. This measure can very advantageously be used in mass-production processes.

The method in accordance with the invention can very advantageously be used in the manufacture of multilayer components, such as CMCs, CMTs and CMAs. The method in accordance with the invention can also be used to accurately and rapidly apply thin wear-resistant layers to a substrate, for example, of metal. Thus, it can also be used to manufacture wear-resistant blades, for example, for shavers.

These and other aspects of the invention will be apparent from and elucidated with reference to the embodiments described hereinafter.

DETAILED DESCRIPTION OF THE INVENTION

It is noted that, for clarity, the Figure is not drawn to scale.

Figure 1A:
FIGS. 1a, 1b, 1c, 1d, 1e, 1f and 1g schematically shows the principle of the method in accordance with the invention.
Figure 1B:
Figure 1C:
Figure 1D:
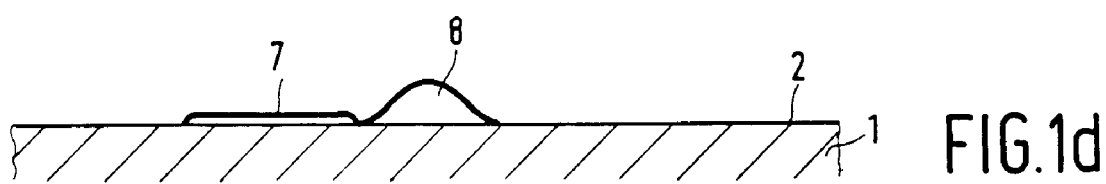
Figure 1E:
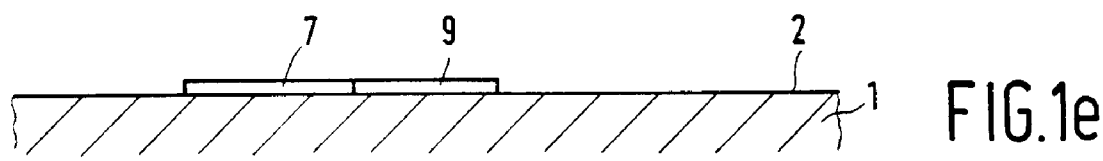
Figure 1F:
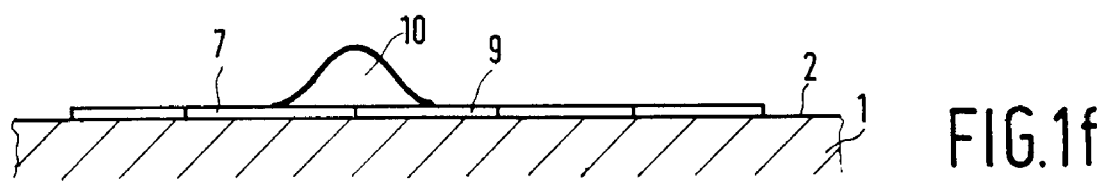
Figure 1G:
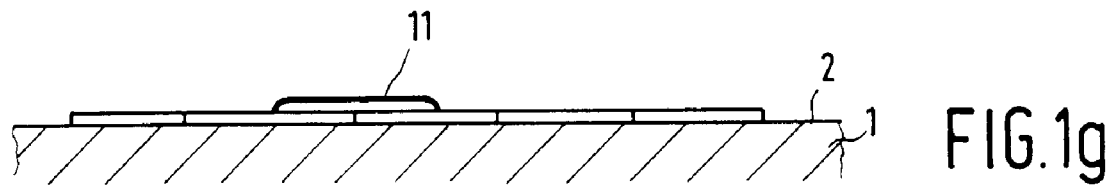

The essence of the invention is explained by means of FIG. 1. A droplet 3 of a liquid charged with particles is provided by means of an ink jet printer (not shown) on a surface 2 of a substrate, for example, of stainless steel or aluminium oxide. This situation is shown in FIG. 1-a. The liquid of the droplet is evaporated by means of a laser pulse 4 (typically 0.1–10 millisecond, 2–10 J/cm$^2$) originating from a laser (not shown), whereafter a relatively thin layer 5 of particles remains on the substrate (FIG. 1-b). The powder layer is sintered instantaneously by means of a more powerful laser pulse 6 (0.01–1 millisecond, 50–200 J/cm$^2$) to form a thin, ceramic layer 7 (FIG. 1-c). As shown, shrinkage of the layer during sintering takes place mainly in a direction at right angles to the substrate. The degree of shrinkage of the layer in a direction parallel to the substrate surface 2 is negligibly small. It is noted that the energy and times used in the inventive method depend from the liquid and particles used.

Subsequently, a second droplet 8 is provided by means of the ink jet printer (FIG. 1-d). Also this droplet is dried and sintered immediately after it has been provided, so that a thin ceramic layer 9 is formed which blends properly with the layer 7, which has already been sintered (FIG. 1-e). By repeating this process a number of times, a relatively large surface can be provided with a thin ceramic layer. The thickness of such a layer provided by means of the method in accordance with the invention typically ranges from 0.1 to 1 micrometer.

This sintered layer can subsequently be provided with a second layer. To this end, again a droplet 10 is provided on the first layer (FIG. 1-f), which droplet is also dried and sintered in order to form a thin ceramic layer 11 (FIG. 1-g). Also in this case a continuous layer of a ceramic material is obtained by repeating the provision, drying and sintering steps a number of times. If desired, the liquid used may contain another type of particles. A multilayer structure can be obtained by alternately providing layers of metal particles (for example, Pd) and layers of metal-oxide particles (for example doped BaTiO$_3$). Dependent upon the type of particles, a ceramic multilayer capacitor, a ceramic multilayer transformer or a ceramic multilayer actuator can be produced in this manner.

EXAMPLE 1

To manufacture a thin layer of quartz glass on a substrate of aluminium oxide use is made of a continuous ink jet printer (Pelikan, Domino, Videojet). Under the influence of a hydrostatic pressure of 6 bar and an excitation frequency of 100 kHz, this ink jet printer produces particle-charged droplets having a sectional dimension of about 80 micrometers. For the liquid use is made of an aqueous solution charged with SiO$_2$ particles (5% suspension of Ludox—Merck). To optimize the rheology of the liquid, small quantities of soap-like and gelatin-like substances are added. The droplets are charged by passing them between two plate electrodes. By virtue thereof, the droplets can be deflected by means of electrostatic fields before landing.

The droplets spread on the surface of the substrate until they cover a surface area having a sectional dimension of approximately 200 micrometers. The thickness of the spread droplets is substantially homogeneous and, dependent upon the exact composition of the liquid, ranges between 1 and 10 micrometers. The substrate is mounted on an x,y-table so that the area to be patterned may be larger than the range of the printer.

The substrate is locally heated, i.e. at the location where the droplet is provided, by means of a CO$_2$ laser having a power density of 100 W/cm$^2$. Irradiation with the laser causes the temperature of the droplet to be increased to the boiling point. As a result, the droplet of solvent (water) evaporates very rapidly, i.e. within 100 milliseconds, without causing damage to the remaining sinterable constituents. The average thickness of the dried droplet is of the order of 1 micrometer. The dried droplet has a porous structure. Dependent upon the size of the laser spot, more than one droplet can be dried at the same time. It is noted that other ways of drying the droplets are also possible, such as heating of the entire substrate or irradiation, for example, with an IR source.

Immediately after drying of one or more droplets, the resultant porous layer is sintered by means of a laser. For this sintering process use is made of a higher energy density than for laser drying. Typical sinter values are 50–100 kW/cm$^2$. For sintering use can be made of a second laser or of the same laser having a higher energy density. The spot size of the laser used is approximately 1 mm$^2$. If use is made of a second laser, the laser optical system used is the same as that employed for the first laser.

After sintering a reduction of the layer thickness to approximately 0.2 micron is observed. The sectional dimension of the layer is substantially equal to that of the originally provided droplet. After sintering, a viscous layer is obtained, which is a typical property of SiO$_2$. The layer actually consists of a continuous, non-porous quartz-glass layer.

EXAMPLE 2

A commercially available ink jet printer, as described in example 1, is used to form a pattern of a particle-charged liquid on a glass substrate. Said liquid comprises a sol-gel solution of TEOTi (tetraethyl orthotitanate) in ethanol, which hydrolyzes slowly, thereby forming particles. Evaporation of the liquid takes place by previously heating the support to a temperature of 95° C. The amorphous, dried layer has a thickness of approximately 0.25 micrometer and consists of a porous network. Subsequently, the layer is sintered with a $CO_2$ pulse laser having an energy density of approximately 10 $kW/cm^2$ for approximately 10 microseconds. In this process, a crystalline $TiO_2$ layer is formed, whose thickness has decreased to approximately 0.04 micrometer. The porosity of the layer decreases to only a few percent.

In summary, the invention relates to a method of manufacturing a sintered structure on a substrate. To this end, a particle-charged liquid is provided on the substrate by means of a (multiple print head) ink jet printer. Subsequently, the liquid is evaporated and the particles contained therein are sintered layer by layer. Said layer-by-layer laser sintering enables 3-dimensional products having a relatively high dimensional accuracy to be manufactured. Preferably, evaporation of the liquid also takes place by means of (the same or) a laser. The liquid preferably comprises particles of glass, ceramics or metal compounds in the form of a sol-gel solution or a colloidal sol.

What is claimed is:

1. A method of manufacturing a sintered structure formed of layers of sintered particles on a substrate, said method comprising providing said substrate with layers of a liquid charged with particles by means of an ink jet printer, evaporating the liquid from each layer and then by means of a laser sintering the particles in said layer before providing a succeeding layer.

2. A method as claimed in claim 1, wherein the liquid is evaporated by means of a laser.

3. A method as claimed in claim 2, wherein the laser employed for evaporating the liquid is also employed for sintering the particles.

4. A method as claimed in claim 1, wherein the liquid charged with particles is a sol-gel solution or a colloidal sol and the particles are glass, ceramics or metal compounds.

5. A method as claimed in claim 1, wherein the ink jet printer has a multiple print head.

\* \* \* \* \*